United States Patent
Hazani et al.

(10) Patent No.: US 9,276,732 B2
(45) Date of Patent: Mar. 1, 2016

(54) FREQUENCY SYNCHRONIZING A LOCAL OSCILLATOR IN A REMOTE UNIT IN A DISTRIBUTED ANTENNA SYSTEM (DAS) USED FOR FREQUENCY SHIFTING COMMUNICATIONS SIGNALS BASED ON A RECEIVED DIGITAL PULSE SIGNAL FROM A CENTRAL UNIT

(71) Applicant: CORNING OPTICAL COMMUNICATIONS WIRELESS LTD, Airport (IL)

(72) Inventors: Ami Hazani, Ra'anana (IL); Ofer Nisan, Netanya (IL); Pavel Rozenbaum, Yehud (IL)

(73) Assignee: CORNING OPTICAL COMMUNICATIONS WIRELESS LTD, Airport (IL)

( * ) Notice: Subject to any disclaimer, the term of this patent is extended or adjusted under 35 U.S.C. 154(b) by 0 days.

(21) Appl. No.: 14/317,438

(22) Filed: Jun. 27, 2014

(65) Prior Publication Data
US 2015/0381342 A1  Dec. 31, 2015

(51) Int. Cl.
*H04L 7/02* (2006.01)
*H04B 7/02* (2006.01)
*H04L 5/00* (2006.01)

(52) U.S. Cl.
CPC ........ *H04L 7/02* (2013.01); *H04B 7/022* (2013.01); *H04L 5/0048* (2013.01)

(58) Field of Classification Search
CPC ...... H04W 88/085; H04W 56/00; H04B 1/44; H04B 17/40; H04B 1/18; H04B 10/25754; H04B 7/024; H04B 7/022; H04L 7/02; H04L 5/0048

See application file for complete search history.

(56) References Cited

U.S. PATENT DOCUMENTS

| 2003/0194982 | A1* | 10/2003 | Lee et al. ....................... 455/259 |
| 2006/0055473 | A1* | 3/2006 | Takayama ........................ 331/57 |
| 2006/0094470 | A1* | 5/2006 | Wake et al. ................. 455/562.1 |
| 2007/0216487 | A1* | 9/2007 | Yang et al. ..................... 331/1 A |
| 2011/0170476 | A1 | 7/2011 | Shapira et al. ................. 370/328 |
| 2012/0177026 | A1* | 7/2012 | Uyehara et al. ............... 370/345 |

* cited by examiner

*Primary Examiner* — Vineeta Panwalkar
(74) *Attorney, Agent, or Firm* — C. Keith Montgomery

(57) ABSTRACT

Frequency synchronizing a local oscillator in a remote unit in a distributed antenna system (DAS) used for frequency shifting communications signals based on a received digital pulse signal from a central unit. A remote unit receives a frequency shifted downlink communications signal and a reference pulse signal indicative of a frequency of a reference oscillator from a central unit. To recover the original signal, a mixing frequency signal generated by a local oscillator is used. To recover a signal having the same frequency as the original signal, the local oscillator should be the same or substantially the same frequency as the frequency used to create the frequency shifted version. A time difference signal indicating the frequency difference between the oscillators is calculated. A frequency adjustment signal is provided to the local oscillator based on the time difference signal to decrease the frequency difference between the oscillators.

15 Claims, 10 Drawing Sheets

FREQUENCY SYNCHRONIZING A LOCAL OSCILLATOR IN A REMOTE UNIT IN A DISTRIBUTED ANTENNA SYSTEM (DAS) USED FOR FREQUENCY SHIFTING COMMUNICATIONS SIGNALS BASED ON A RECEIVED DIGITAL PULSE SIGNAL FROM A CENTRAL UNIT

BACKGROUND

The disclosure relates generally to synchronizing local oscillators, and more particularly to providing devices, systems, and methods, including in distributed antenna systems (DASs), to synchronize local oscillators.

Wireless communication is rapidly growing, with ever-increasing demands for high-speed mobile data communication. As an example, local area wireless services (e.g., so-called "wireless fidelity" or "WiFi" systems) and wide area wireless services are being deployed in many different types of areas (e.g., coffee shops, airports, libraries, etc.). Distributed communications or antenna systems communicate with wireless devices called "clients," "client devices," or "wireless client devices," which must reside within the wireless range or "cell coverage area" in order to communicate with an access point device. DASs are particularly useful to be deployed inside buildings or other indoor environments where client devices may not otherwise be able to effectively receive radio-frequency (RF) signals from a source, such as a base station for example. Example applications where DASs can be used to provide or enhance coverage for wireless services include public safety, cellular telephony, wireless local access networks (LANs), location tracking, and medical telemetry inside buildings and over campuses.

A DAS is a type of communications system that may distribute analog communications signals. In a DAS, communications signals can be distributed from a central unit (which can also be referred to as a head-end unit) to one or more remote units forming remote coverage areas. Local oscillators (LO) may be provided in communications components in a DAS to frequency down convert or up convert distributed communications signals for distribution. In this regard, FIG. 1A illustrates an exemplary DAS 10 that provides distribution of communications signals to provide communications services to coverage areas 12(1)-12(N) in the DAS 10, where N is the number of coverage areas. These communications services can include cellular services, such as a cellular service operating using the Long Term Evolution (LTE) cellular protocol, for example. The coverage areas 12(1)-12(N) may be remotely located. In this case, the remote coverage areas 12(1)-12(N) are created by and centered on remote units 14(1)-14(N) coupled to a central unit 16. The central unit 16 may be communicatively coupled to a base station 18. In this regard, the central unit 16 receives downlink communications signals 20D from the base station 18 to be distributed to the remote units 14(1)-14(N). The remote units 14(1)-14(N) are configured to receive the downlink communications signals 20D from the central unit 16 over a communications medium 22 (e.g., coaxial cable, fiber optic cable) to be distributed to the respective coverage areas 12(1)-12(N) of the remote units 14(1)-14(N). Each remote unit 14(1)-14(N) may include one or more RF transmitters/receivers (not shown) and respective antennas 24(1)-24(N) operably coupled to the RF transmitters/receivers to wirelessly distribute the communications services to client devices 26 within their respective coverage areas 12(1)-12(N). The remote units 14(1)-14(N) are also configured to receive analog uplink communications signals 20U from the client devices 26 in their respective coverage areas 12(1)-12(N) to be distributed to the base station 18.

The communications medium 22 in the DAS 10 of FIG. 1A may be limited in bandwidth capability. For example, if the communications medium 22 is CAT5 cable, the communications medium 22 is limited to or rated for 100 Megahertz (MHz) bandwidth at 100 meters (m) distance. As such, if the downlink communications signals 20D require greater bandwidth capacity than the bandwidth capacity of the communications medium 22, the downlink communications signals 20D may be frequency down shifted by the central unit 16 to an intermediate frequency (IF) before transmission over the communications medium 22 to the one or more remote units 14(1)-14(N). The downlink communications signals 20D at the IF can then be frequency shifted back to their original frequency in the remote units 14(1)-14(N) before being transmitted over the respective antenna 24(1)-24(N).

In this regard, FIG. 1B illustrates exemplary internal components of the central unit 16 and a remote unit 14 in the DAS 10 of FIG. 1A for frequency shifting communications signals. Only downlink communications signals 20D are shown as being frequency shifted in the DAS 10 in FIG. 1A, but the uplink communications signals 20U can also be frequency shifted. The central unit 16 receives the downlink communications signals 20D and mixes the downlink communications signals 20D in mixer 28 with a frequency signal 29 generated by local oscillator 30 to generate IF signals 32D. The frequency signal 29 generated by the local oscillator 30 is controlled by a frequency signal 33 generated by a reference oscillator 34, which may be a highly stable oscillator to in turn provide for the frequency signal 29 generated by the local oscillator 30 to be highly stable. The IF signals 32D are filtered by a filter 36 and amplified by power amplifier 38 before being transmitted over the communications medium 22 to the remote units 14(1)-14(N).

To recover the original frequency of the downlink communications signals 20D at the remote unit 14 to be radiated by the antenna 24, local oscillator 40 is provided in the remote unit 14. The local oscillator 40 generates a frequency signal 41 of the same frequency as the local oscillator 30, which is mixed with the IF signal 32D in mixer 50. Thus, the mixing of the frequency signal 41 with the IF signal 32D frequency shifts the IF signals 32D back to the original frequency of the downlink communications signals 20D to recreate the downlink communications signals 20D To ensure that the frequency of the frequency signal 29 generated by the local oscillator 30 and the frequency of the frequency signal 41 generated by the local oscillator 40 are the same or substantially the same, the frequency signal 33 generated by the reference oscillator 34 is combined with the IF signals 32D in the central unit 16 by combiner 42 as a frequency tone 44 and distributed on the communications medium 22 to the remote unit 14.

In the remote unit 14, the IF signals 32D are passed through a narrow bandpass filter 46 to recover the reference oscillator 34 frequency tone 44. The local oscillator 40 in the remote unit 14 can then be synchronized to some ratio of the recovered reference oscillator 34 frequency tone 44 by employing a phase locked loop (PLL) circuit 48 or by other means such that the frequency of the frequency signal 29 generated by the local oscillator 30 and the frequency of the frequency signal 41 generated by the local oscillator 40 are the same or substantially the same. With the local oscillator 40 of the remote unit 14 synchronized to the local oscillator 30 in the central unit 16 used to create the IF signals 32D, the IF signals 32D received by the remote unit 14 can be mixed at mixer 50 with a frequency generated by local oscillator 40 to recover the downlink communications signals 20D. The downlink communications signals 20D are filtered by filter 52 and amplified by power amplifier 54 before being transmitted by antenna 24.

As transmission signals are sent over the communications medium 22 to the remote unit 14, interference can occur between the IF signals 32D and the reference oscillator 34 frequency tone 44. Therefore, a more precise bandpass filter 46 may be required to recover the reference oscillator 34 frequency tone 44. The more precise bandpass filter 46 can be expensive and/or large.

No admission is made that any reference cited herein constitutes prior art. Applicant expressly reserves the right to challenge the accuracy and pertinence of any cited documents.

SUMMARY

Aspects disclosed herein include frequency synchronizing a local oscillator in a remote unit in a distributed antenna system (DAS) used for frequency shifting communications signals based on a received digital pulse signal from a central unit. In this regard, in one aspect, a remote unit receives a combined downlink signal from a central unit over a communications medium. The combined downlink signal comprises a frequency shifted downlink communications signal and a reference pulse signal. The frequency shifted downlink communications signal is a frequency shifted version of a downlink communications signal received by the central unit. To recover the downlink communications signal, the remote unit mixes the frequency shifted downlink communications signal with a mixing frequency signal generated by a local oscillator. To provide for the recovered downlink communications signal to have the same or substantially the same frequency as the original downlink communications signal, the frequency of the local oscillator is controlled to be the same or substantially the same as the frequency of the signal used to create the frequency shifted downlink communications signal in the central unit. The remote unit uses the reference pulse signal to calculate a time difference signal indicative of a difference between the frequency of the reference oscillator and the frequency of the local oscillator. The remote unit then provides a frequency adjustment signal to the local oscillator based on the time difference signal to decrease the difference between the frequency of the reference oscillator and the frequency of the local oscillator. This frequency adjustment signal synchronizes the frequency of the reference oscillator and the frequency of the local oscillator.

One aspect of the disclosure relates to a remote unit in a DAS. The remote unit comprises a radio signal interface configured to receive a combined downlink signal from a central unit over a communications medium. The combined downlink signal comprises a downlink communications signal and a reference pulse signal. The reference pulse signal is indicative of a frequency of a reference oscillator in the central unit. The remote unit also comprises a local oscillator configured to generate a mixing frequency signal based on a frequency adjustment signal. The remote unit also comprises a time difference unit. The time difference unit comprises a reference pulse input configured to receive the reference pulse signal from the combined downlink signal. The time difference unit also comprises a pulse input configured to receive a pulse signal indicative of a frequency of the local oscillator. The time difference unit is configured to provide a time difference signal on a time difference output. The time difference signal is indicative of a difference between the frequency of the reference oscillator and the frequency of the local oscillator. The central unit also comprises a frequency adjustment unit. The frequency adjustment unit comprises a time difference input electrically coupled to the time difference output of the time difference unit. The time difference input is configured to receive the time difference signal. The frequency adjustment unit also comprises a frequency adjustment output electrically coupled to the local oscillator. The frequency adjustment unit is configured to provide a frequency adjustment signal on the frequency adjustment output based on the time difference signal received on the time difference input to decrease the difference between the frequency of the reference oscillator and the frequency of the local oscillator.

An additional aspect of the disclosure relates to a method for frequency synchronizing a local oscillator in a remote unit in a DAS. The method comprises receiving a combined downlink signal comprising a downlink communications signal and a reference pulse signal indicative of a frequency of a reference oscillator in a central unit. The method also comprises receiving a pulse signal indicative of a frequency of the local oscillator. The method also comprises providing a time difference signal indicative of a difference between the frequency of the reference oscillator and the frequency of the local oscillator. The method also comprises providing a frequency adjustment signal to the local oscillator based on the time difference signal to decrease the difference between the frequency of the reference oscillator and the frequency of the local oscillator.

An additional aspect of the disclosure relates to a DAS. The DAS comprises a central unit. The central unit is configured to receive a downlink communications signal from a communications system and distribute a combined downlink signal over at least one communications medium to a plurality of remote units. The combined downlink signal comprises the downlink communications signal and a reference pulse signal. The reference pulse signal is indicative of a frequency of a reference oscillator in the central unit. Each remote unit among the plurality of remote units comprises a radio signal interface configured to receive the combined downlink signal from the central unit over one of the at least one communications medium. Each remote unit also comprises a local oscillator configured to generate a mixing frequency signal based on a frequency adjustment signal. Each remote unit also comprises a time difference unit. The time difference unit comprises a reference pulse input configured to receive the reference pulse signal from the combined downlink signal. The time difference unit also comprises a pulse input configured to receive a pulse signal indicative of a frequency of the local oscillator. The time difference unit is configured to provide a time difference signal on a time difference output. The time difference signal is indicative of a difference between the frequency of the reference oscillator and the frequency of the local oscillator. Each remote unit also comprises a frequency adjustment unit. The frequency adjustment unit comprises a time difference input electrically coupled to the time difference output of the time difference unit. The time difference input is configured to receive the time difference signal. The frequency adjustment unit also comprises a frequency adjustment output electrically coupled to the local oscillator. The frequency adjustment unit is configured to provide a frequency adjustment signal on the frequency adjustment output based on the time difference signal received on the time difference input to decrease the difference between the frequency of the reference oscillator and the frequency of the local oscillator.

Additional features and advantages will be set forth in the detailed description which follows, and in part will be readily apparent to those skilled in the art from the description or recognized by practicing the aspects as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more aspects, and together with the description serve to explain principles and operation of the various aspects.

DETAILED DESCRIPTION

Various embodiments will be further clarified by the following examples.

Aspects disclosed herein include frequency synchronizing a local oscillator in a remote unit in a distributed antenna system (DAS) used for frequency shifting communications signals based on a received digital pulse signal from a central unit. In this regard, in one aspect, a remote unit receives a combined downlink signal from a central unit over a communications medium. The combined downlink signal comprises a frequency shifted downlink communications signal and a reference pulse signal. The frequency shifted downlink communications signal is a frequency shifted version of a downlink communications signal received by the central unit. To recover the downlink communications signal, the remote unit mixes the frequency shifted downlink communications signal with a mixing frequency signal generated by a local oscillator. To provide for the recovered downlink communications signal to have the same or substantially the same frequency as the original downlink communications signal, the frequency of the local oscillator is controlled to be the same or substantially the same as the frequency of the signal used to create the frequency shifted downlink communications signal in the central unit. The remote unit uses the reference pulse signal to calculate a time difference signal indicative of a difference between the frequency of the reference oscillator and the frequency of the local oscillator. The remote unit then provides a frequency adjustment signal to the local oscillator based on the time difference signal to decrease the difference between the frequency of the reference oscillator and the frequency of the local oscillator. This frequency adjustment signal synchronizes the frequency of the reference oscillator and the frequency of the local oscillator.

Figure 1A:
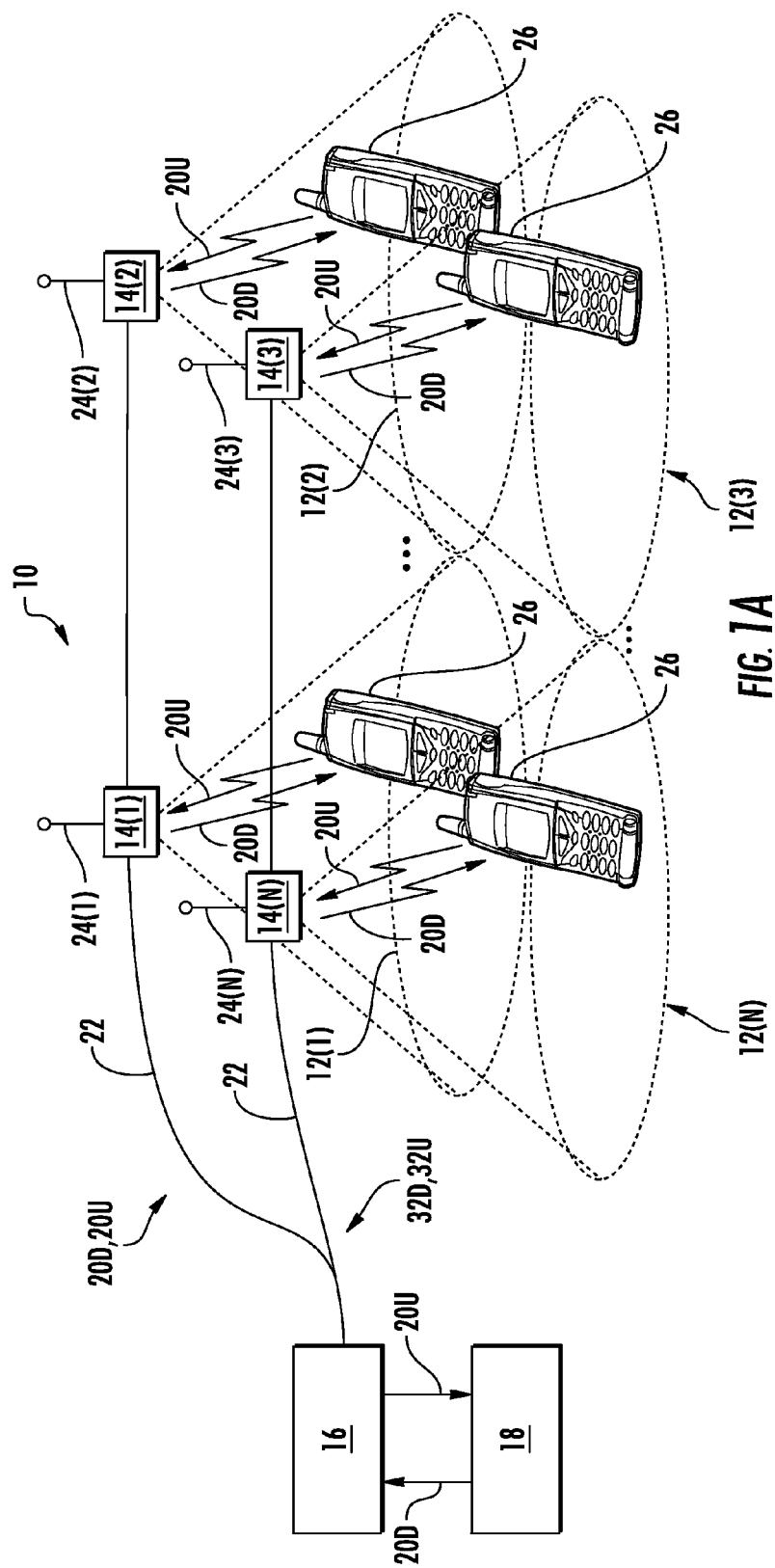
FIG. 1A is a schematic diagram of an exemplary distributed antenna system (DAS) capable of distributing radio frequency (RF) communications services to client devices, wherein the DAS may include multiple remote units with local oscillators that need to be frequency synchronized with a reference oscillator in the central unit.
Figure 1B:
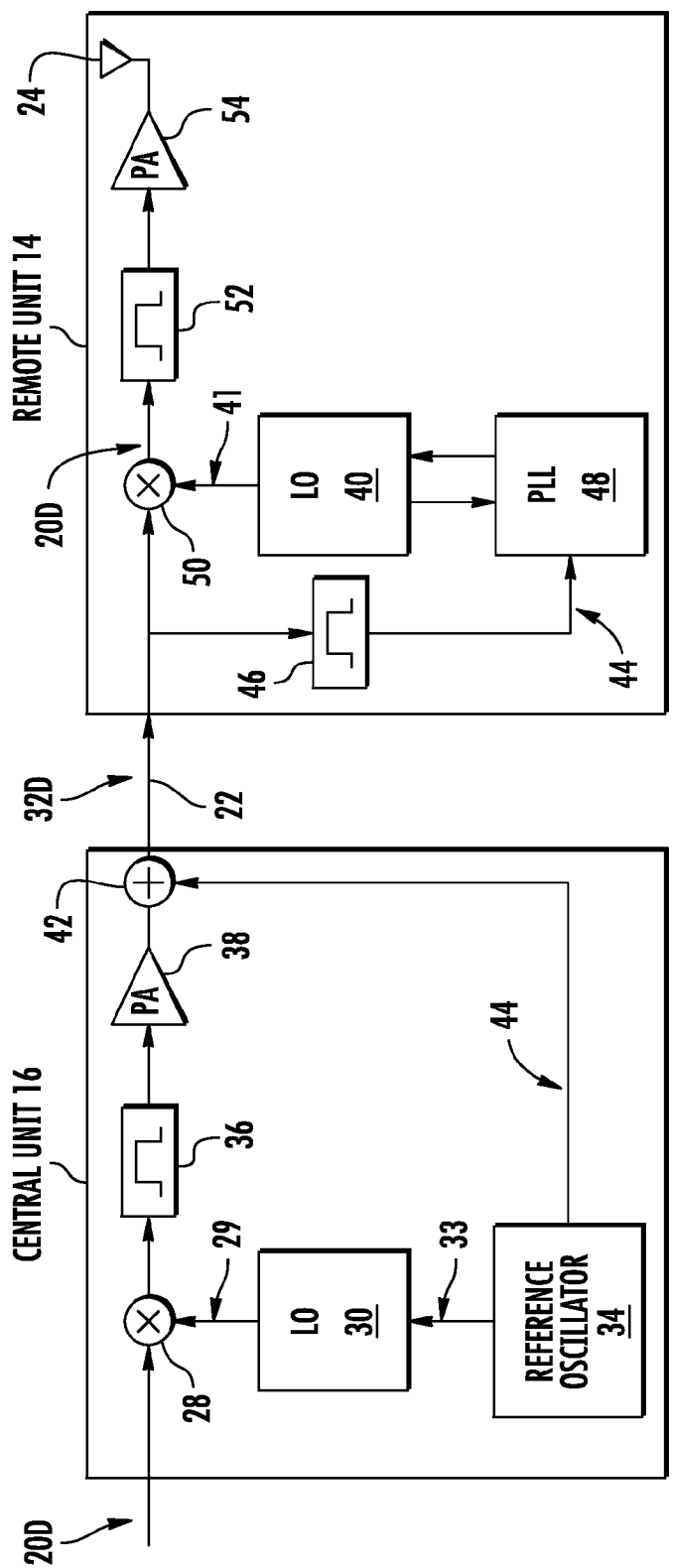
FIG. 1B is a schematic diagram of the DAS in FIG. 1A illustrating exemplary components for frequency shifting downlink communications signals to an intermediate frequency (IF) signal in a central unit and frequency shifting the IF signal back to the original frequency of the downlink communication signal.
Figure 2:
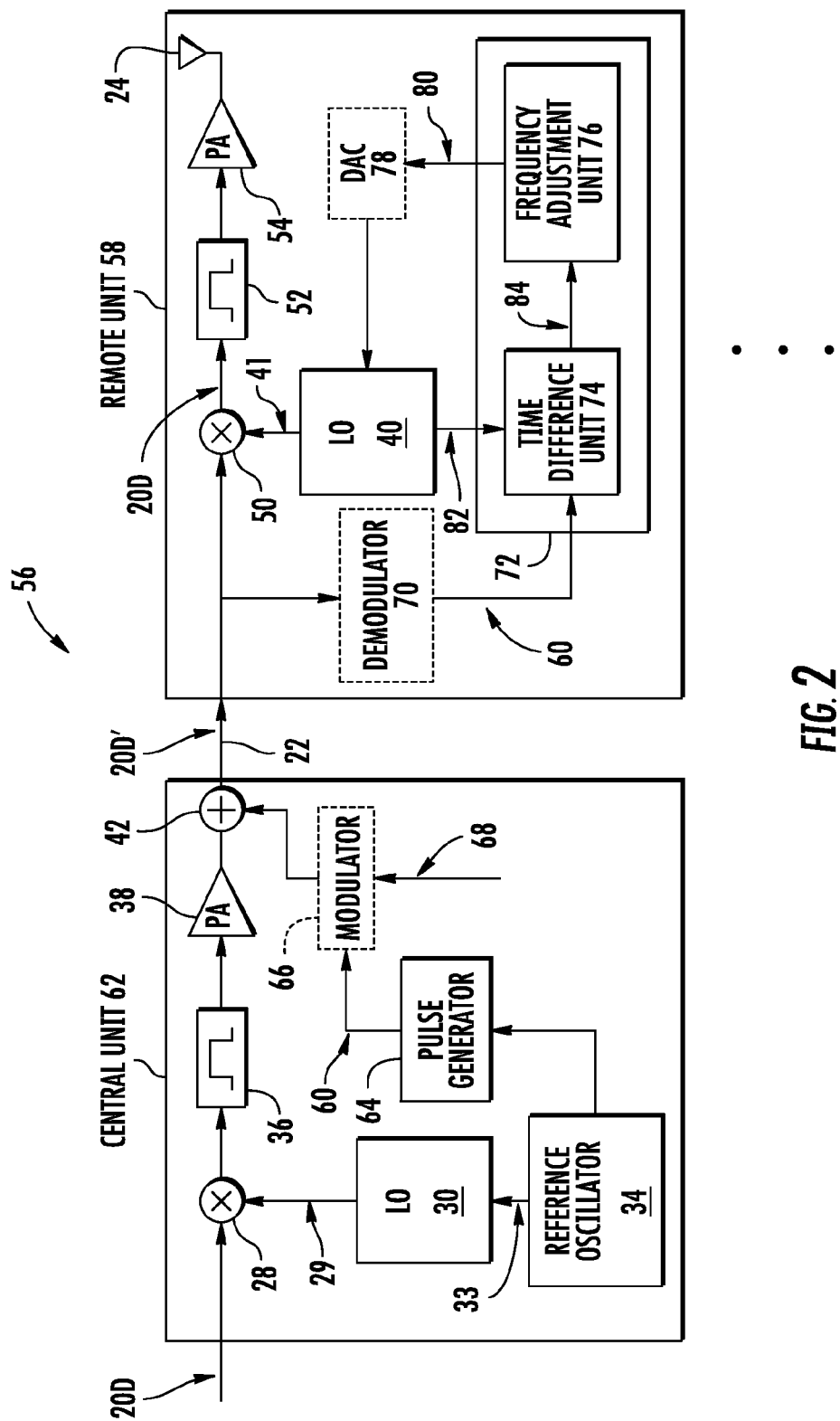
FIG. 2 is a schematic diagram of an exemplary DAS for frequency synchronizing a local oscillator in a remote unit in a DAS used for frequency shifting communications signals based on a received digital pulse signal from a central unit, according to one embodiment.

In this regard, FIG. 2 is a schematic diagram of an exemplary DAS 56 for frequency synchronizing a local oscillator 40 in a remote unit 58 used for frequency shifting communications signals 20D and 20U based on a received digital pulse signal 60 from a central unit 62, according to one embodiment. The remote unit 58 is configured to receive downlink communications signals 20D from the central unit 62 over a communications medium 22 (e.g., coaxial cable, fiber optic cable). Although only one remote unit 58 is shown in FIG. 2, multiple remote units 58(1)-58(N) could be provided. Remote unit 58 may include one or more RF transmitters/receivers (not shown) and respective antennas 24(1)-24(N) (only a single antenna 24 is shown for simplicity) operably coupled to the RF transmitters/receivers to wirelessly distribute the communications services.

The communications medium 22 in the DAS 56 of FIG. 2 may be limited in bandwidth capability. For example, if the communications medium 22 is CAT5 cable, the communications medium 22 is limited to or rated for 100 Megahertz (MHz) bandwidth at 100 meters (m). As such, if the downlink communications signals 20D require greater bandwidth capacity than provided by the communications medium 22, the downlink communications signals 20D may be frequency shifted by the central unit 62 to an intermediate frequency (IF) (either higher or lower than the original frequency) before transmission over the communications medium 22 to the remote unit 58. The frequency shifted downlink communications signals 20D' can then be frequency shifted back to their original frequency in the remote unit 58. Only downlink communications signals 20D are shown as being frequency shifted in FIG. 2, but the uplink communications signals 20U can also be frequency shifted. The central unit 62 receives the downlink communications signals 20D and mixes them at mixer 28 with a frequency signal 29 generated by local oscillator 30 to generate the frequency shifted downlink communications signals 20D'. The frequency signal 29 generated by the local oscillator 30 is controlled by a frequency signal 33 generated by a reference oscillator 34, which may be a highly stable oscillator to in turn provide for the frequency signal 29 generated by the local oscillator 30 to be highly stable The frequency shifted downlink communications signals 20D' are filtered by filter 36 and amplified by power amplifier 38 before being transmitted over the communications medium 22.

To recover the downlink communications signals 20D at the remote unit 58 to be radiated by the antenna 24, local oscillator 40 is provided in the remote unit 58 to convert the frequency shifted downlink communications signals 20D' to the downlink communications signals 20D. In order to recover the downlink communications signals 20D, the frequency signal 41 generated by the local oscillator 40 in the remote unit 58 is controlled in this example to be the same or substantially the same as the frequency of the frequency signal 29 of the local oscillator 30 in the central unit 62 used to shift the downlink communications signals 20D. As used herein, the frequency of the frequency signal 41 generated by the local oscillator 40 in the remote unit 58 is substantially the same as the frequency of the frequency signal 29 generated by the local oscillator 30 if the frequency of the frequency signal 41 is within a factor of $10^{-8}$ of the frequency of the frequency signal 29. For example, if the frequency of the frequency signal 29 is 10 megahertz (MHz), the frequency of the frequency signal 41 is substantially the same if the frequency is within 0.1 hertz (Hz) of 10 MHz.

In order that frequency of the frequency signal 29 and the frequency of the frequency signal 41 are the same or substantially the same, the frequency signal 33 from the reference oscillator 34 (or local oscillator 30, depending on implementation) is fed into a pulse generator 64 that creates a reference pulse signal 60 indicative of the frequency of the reference oscillator 34. The reference pulse signal 60 is then combined into the frequency shifted downlink communications signals 20D' in the central unit 62 by combiner 42 after being optionally modulated by modulator 66. In this example, the reference pulse signal 60 is modulated with a digital management signal 68. The digital management signal 68 may be a signal that can provide information or instructions to the central unit 62 and/or be passed to the remote unit 58 to control operations of those units, such as gain adjustment, configurations, testing operations, and others. The frequency shifted downlink communications signals 20D' are then distributed on the communications medium 22 to the remote unit 58.

In the remote unit 58, the frequency shifted downlink communications signals 20D' are passed through an optional demodulator 70 (to reverse any modulation by modulator 66 in the central unit 62, according to one embodiment) to recover the reference pulse signal 60. The local oscillator 40 in the remote unit 58 can then be synchronized by a frequency synchronization unit 72. The frequency synchronization unit 72 comprises a time difference unit 74 and a frequency adjustment unit 76. Depending on the implementation of the frequency synchronization unit 72 and the local oscillator 40, an optional digital-to-analog converter (DAC) 78 may be provided to convert a frequency adjustment signal 80 from the frequency adjustment unit 76 to an analog signal. In one embodiment where the DAC 78 is needed, the local oscillator is a voltage-controlled oscillator that is capable of adjusting the frequency of the local oscillator 40 based on a received frequency adjustment signal 80 represented as an analog voltage level. This is merely one exemplary embodiment and any other configurable local oscillator could also be used for local oscillator 40. The time difference unit 74 uses the reference pulse signal 60 indicative of the frequency of a reference oscillator 34 in the central unit 62 and a pulse signal 82 indicative of the frequency of the local oscillator 40 to provide a time difference signal 84 indicative of a difference between the frequency of the reference oscillator 34 and the frequency of the local oscillator 40. This time difference signal 84 is used by the frequency adjustment unit 76 to provide the previously discussed frequency adjustment signal 80 to the local oscillator 40 to decrease the difference between the frequency of the reference oscillator 34 and the frequency of the local oscillator 40.

Figure 3:
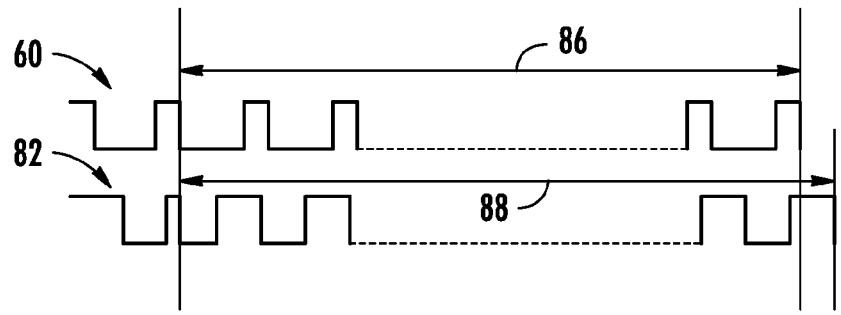
FIG. 3 is a timing diagram illustrating the relative timing differences between the frequency of the reference oscillator in the central unit and the frequency of the local oscillator in the remote unit where the timing is different to allow the time difference unit in FIG. 2 to provide a time difference signal, according to one embodiment.

To illustrate one embodiment of how the time difference unit 74 operates to provide a time difference signal 84 indicative of a difference between the frequency of the reference oscillator 34 and the frequency of the local oscillator 40, FIG. 3 illustrates an example reference pulse signal 60 indicative of the frequency of the reference oscillator 34 in the central unit 62 and an example pulse signal 82 indicative of the frequency of the local oscillator 40 in the remote unit 58. In this example, the two frequencies are not the same. The time difference unit 74 (shown in FIG. 2) determines a first amount of time 86 in which the time difference unit 74 receives the predefined number of pulses from the reference pulse signal 60. The time difference unit 74 also determines a second amount of time 88 in which the time difference unit 74 receives the predefined number of pulses from the pulse signal 82. In this example, the time difference unit 74 provides a time difference signal 84 (shown in FIG. 2) that is indicative of a difference between the first amount of time 86 and the second amount of time 88. Note that in FIG. 3, the pulses are counted on the falling edges of the pulses. This depends on implementation and the pulses could alternatively be counted on the rising edges of the pulses or using any other suitable technique.

Returning to FIG. 2, with the local oscillator 40 of the remote unit 58 synchronized to the local oscillator 30 in the central unit 62 used to create the frequency shifted downlink communications signals 20D', the frequency shifted downlink communications signals 20D' received by the remote unit 58 can be mixed at mixer 50 with a frequency generated by local oscillator 40 to recover the downlink communications signals 20D. The downlink communications signals 20D are filtered by filter 52 and amplified by power amplifier 54 before being transmitted by antenna 24. A similar process is performed on the analog uplink communications signals 20U. For simplicity, this process is not shown in FIG. 2, but the same local oscillators 30, 40 may be used in the conversion process and therefore do not require additional synchronization.

Figure 4:
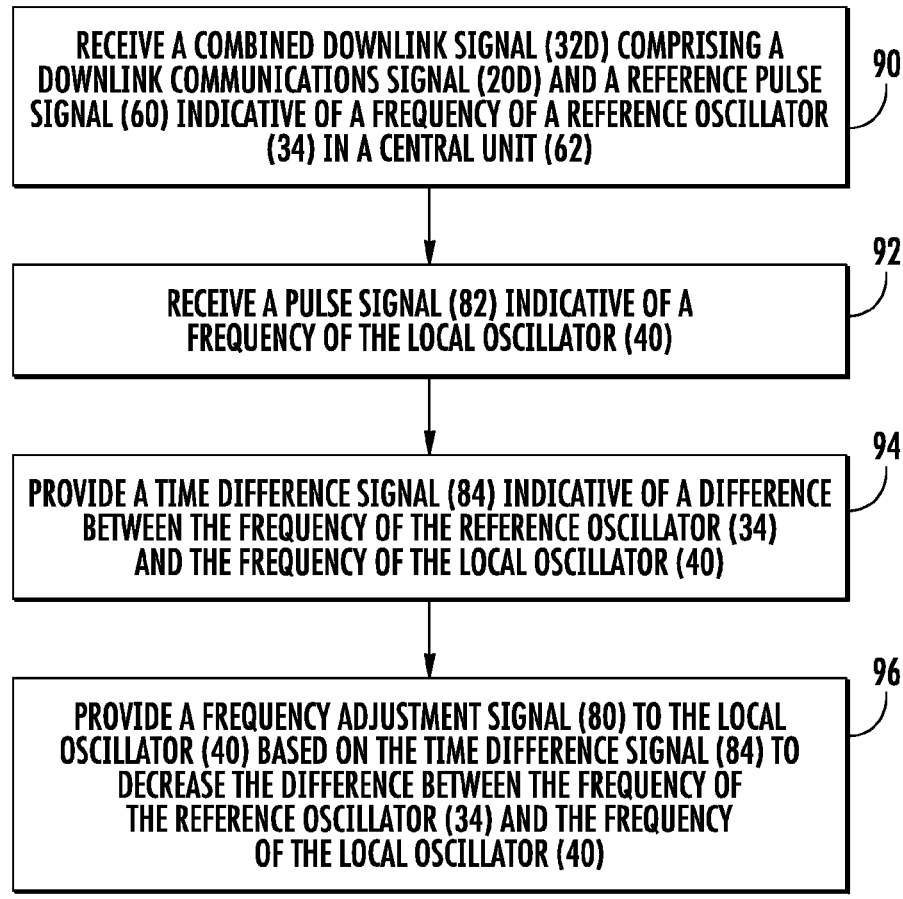
FIG. 4 is a flowchart illustrating an exemplary process for frequency synchronizing a local oscillator in a remote unit in the DAS of FIG. 2 used for frequency shifting communications signals based on a received digital pulse signal from a central unit, according to one embodiment.

To further explain an exemplary process of operating the DAS 56 in FIG. 2 for frequency synchronizing a local oscillator in a remote unit in the DAS 56 used for frequency shifting communications signals based on a received digital pulse signal from a central unit, the flowchart in FIG. 4 is provided. As discussed above, the remote unit 58 receives a combined downlink signal such as frequency shifted downlink communications signals 20D' comprising a downlink communications signal 20D and a reference pulse signal 60 indicative of a frequency of a reference oscillator 34 in a central unit 62 (block 90). Next, the remote unit 58 receives a pulse signal 82 indicative of a frequency of the local oscillator 40 (block 92). These signals are provided to the time difference unit 74. The time difference unit 74 is then able to provide a time difference signal 84 indicative of a difference between the frequency of the reference oscillator 34 and the frequency of the local oscillator 40 (block 94). This time difference signal 84 is provided to the frequency adjustment unit 76. The frequency adjustment unit 76 then provides a frequency adjustment signal 80 to the local oscillator 40 based on the time difference signal 84 to decrease the difference between the frequency of the reference oscillator 34 and the frequency of the local oscillator 40 (block 96).

Figure 5:
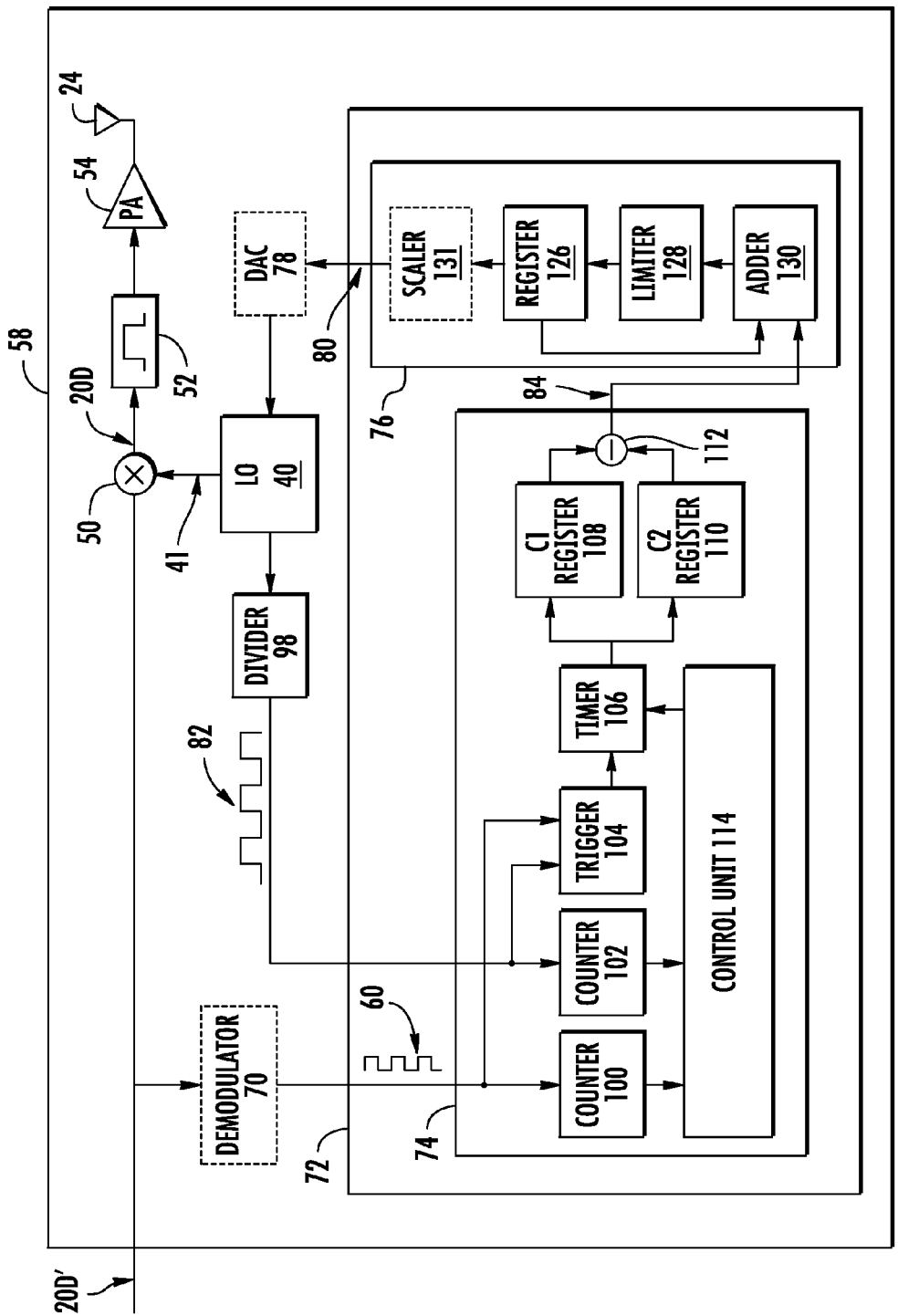
FIG. 5 is a more detailed schematic diagram of an exemplary remote unit in FIG. 2 for frequency synchronizing a local oscillator in a remote unit in a DAS used for frequency shifting communications signals based on a received digital pulse signal from a central unit, according to one embodiment.

FIG. 5 is a more detailed schematic diagram of exemplary components that can be provided in the remote unit 58 in FIG. 2 for frequency synchronizing a local oscillator 40 in a remote unit 58 in a DAS used for frequency shifting communications signals based on a received digital pulse signal from a central unit 62. Many elements in FIG. 5 are the same element with common numbering as shown and described above in FIG. 2, and thus will not necessarily be re-described. In this example, the pulse signal 82 indicative of a frequency of the local oscillator 40 is provided by dividing the output signal from the local oscillator 40 using divider 98. In one specific example where the local oscillator 40 operates at 10 MHz, the divider 98 may provide a pulse once every 150,000 cycles. This would provide a pulse signal 82 where each pulse would have a period of 15 milliseconds (ms) (150,000/10 MHz). This divider 98 may be chosen or adjusted to compensate for any differences in the frequency of the reference oscillator 34 and the local oscillator 30 in the central unit 62 (shown in FIG. 2). The divider 98 may also be used to compensate for any division that may be included in the pulse generator 64 of the central unit 62.

The frequency synchronization unit 72 of FIG. 5 again comprises a time difference unit 74 and a frequency adjustment unit 76. In this example, the time difference unit 74 is shown comprising a reference pulse counter 100 configured to count pulses received from the reference pulse signal 60 and a pulse counter 102 configured to count pulses received from the pulse signal 82. There is also a trigger 104 that can activate timer 106. Two registers are also provided named C1 register 108 and C2 register 110 and are connected to the output of the time difference unit 74 by a subtractor 112 which provides the difference of the values stored in C1 register 108 and C2 register 110. The time difference unit 74 also comprises a control unit 114 which is programmed to control the operation of the other elements of the time difference unit 74. The control unit 114 can be implemented in many ways, but implementing the control unit 114 as a Field Programmable Gate Array (FPGA) provides very low latency and still provides some reconfigurability. This is merely one possible example and other possible examples will be discussed later in relation to FIG. 10.

Figure 6:
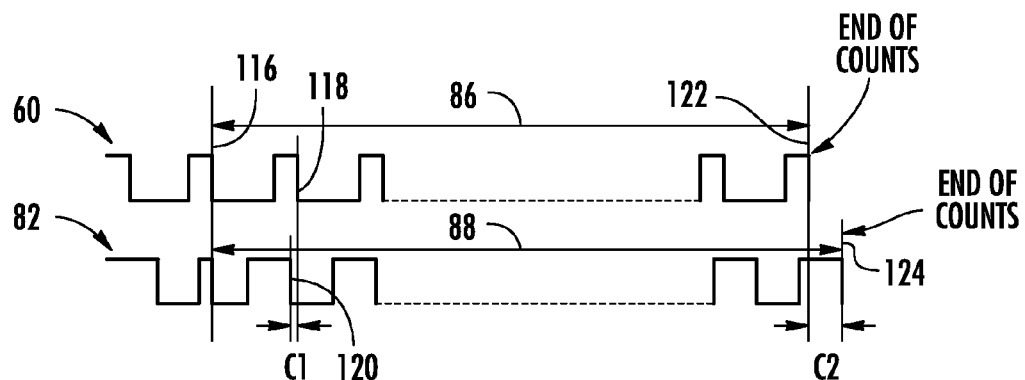
FIG. 6 illustrates example digital pulse signals indicative of the frequency of the reference oscillator in the central unit and the local oscillator in the remote unit and illustrates a first amount of time in which the time difference unit receives the predefined number of pulses from the reference pulse signal and a second amount of time in which the time difference unit receives the predefined number of pulses from the pulse signal, according to one embodiment.

Operation of the time difference unit 74 of FIG. 5 will be discussed in relation to FIG. 6 which illustrates an example reference pulse signal 60 and an example pulse signal 82. At the start of the synchronization process, the control unit 114 waits for the falling edge of the reference pulse signal 60 to begin (event 116 in FIG. 6) (as discussed above, the pulses could alternatively be counted on the rising edges of the pulses or using any other suitable technique). At this point, the control unit 114 initializes all necessary values such as setting reference pulse counter 100 and pulse counter 102 to zero. The control unit 114 may also reset the divider 98 and the timer 106. Next, the time difference unit 74 continues to count the pulses arriving from the reference pulse signal 60 (first counted pulse represented by event 118 in FIG. 6) and store the current count value in reference pulse counter 100. The time difference unit 74 also continues to count the pulses arriving from the pulse signal 82 (first counted pulse represented by event 120 in FIG. 6) and store the current count value in reference pulse counter 102. The time difference between the first pulses of the two signals is represented as C1 and accounts for the phase difference between the two signals. This value is calculated by using the trigger 104 to start the timer 106 upon receiving the first of the first pulses and using the trigger 104 to stop the timer 106 upon receiving the second of the first pulses. The value of timer 106 when stopped is stored in C1 register 108. Depending on implementation, the timer 106 is cleared before the next measurements are taken. When the first of the reference pulse counter 100 and pulse counter 102 reaches the predefined count value (the first predefined count is represented by event 122 in FIG. 6), the trigger 104 is again used to start the timer 106. When the second counter reaches the predefined count value (the second predefined count is represented by event 124 in FIG. 6), the trigger 104 is used to stop the timer 106. The time difference between the last pulses of the two signals is represented as C2 and accounts for the frequency difference without compensation for the phase difference C1 between the two signals. The value of timer 106 when stopped this time corresponds to the time difference between the two signals and is stored in C2 register 110. In order to provide a time difference signal 84 indicative of a difference between the frequency of the reference oscillator 34 and the frequency of the local oscillator 40, the time difference unit 74 subtracts C1 from C2 using subtractor 112.

The frequency adjustment unit 76 of FIG. 5 includes a register 126, a limiter 128, and an adder 130. The frequency adjustment unit 76 may optionally include a scaler 131. In this example, the register 126 holds the value for the frequency adjustment signal 80 provided by the frequency adjustment unit 76. The value supplied in the time difference signal 84 is added to the value in register 126 by adder 130. Before the updated value is stored in the register 126, the value is first passed through the limiter 128. The limiter 128 is further configured to limit the frequency adjustment signal 80 to be within a range of values acceptable to the local oscillator 40. For instance, if the value resulting from adder 130 is greater than the maximum acceptable value to the local oscillator 40, the limiter 128 will set the value of register 126 to be the maximum acceptable value. Conversely, if the value resulting from adder 130 is less than the minimum acceptable value to the local oscillator 40, the limiter 128 will set the value of register 126 to be the minimum acceptable value. Otherwise, the limiter 128 will set the value of register 126 to be the value resulting from adder 130. This is merely one possible example of providing a frequency adjustment signal 80 based on the time difference signal 84 received to decrease the difference between the frequency of the reference oscillator 34 and the frequency of the local oscillator 40. Other examples may provide the optional scaler 131 which may be used to compensate for a nonlinearity of the relationship between the time difference signal 84 and the frequency adjustment signal 80 needed to correct for the difference in the frequency of the reference oscillator 34 and the frequency of the local oscillator 40. In one embodiment, the scaler 131 calculates the frequency adjustment signal 80 formulaically based on the time difference signal 84. In another embodiment, the scaler 131 provides the frequency adjustment signal 80 by consulting a lookup table using the time difference signal 84.

Figure 7A:
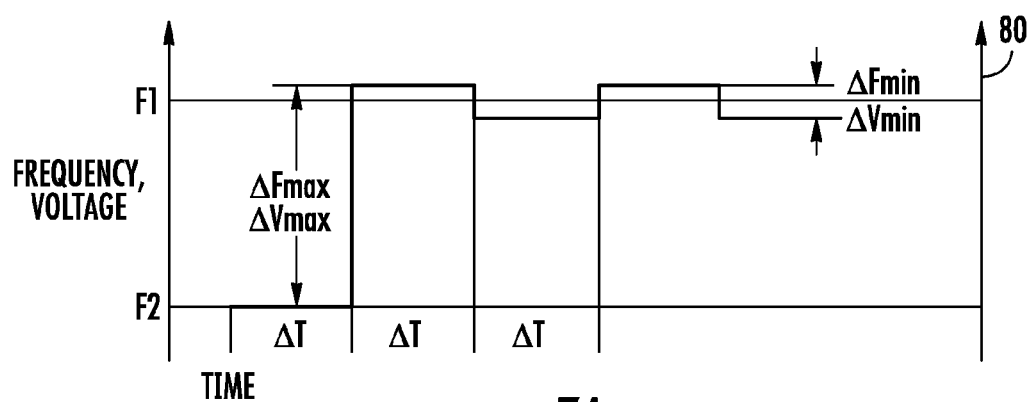
FIGS. 7A and 7B illustrate how the frequency of a local oscillator can be adjusted using a frequency adjustment signal to decrease the difference between the frequency of the reference oscillator and the frequency of the local oscillator, according to one embodiment.
Figure 7B:
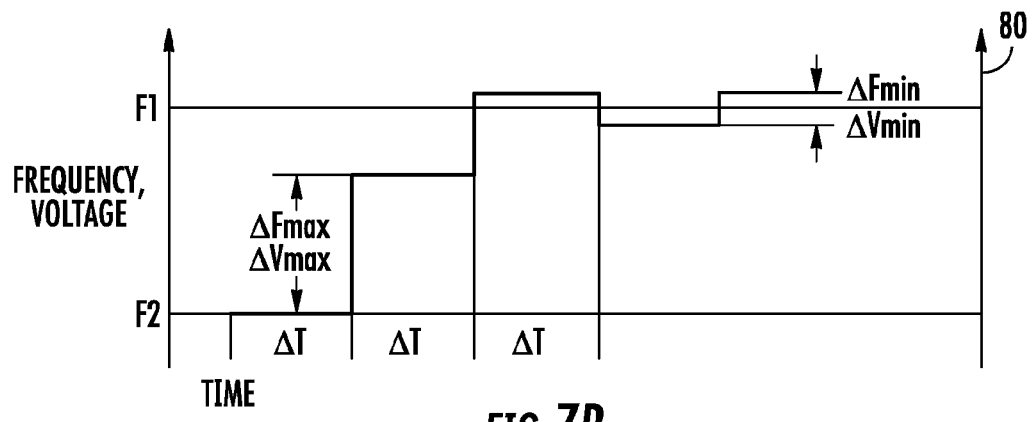

Operation of the frequency adjustment unit 76 of FIG. 5 will also be discussed in relation to FIGS. 7A and 7B which illustrate how the frequency of the local oscillator 40 can be adjusted using a frequency adjustment signal 80 to decrease the difference between the frequency of the reference oscillator 34 and the frequency of the local oscillator 40, according to one embodiment. In the embodiments of FIGS. 7A and 7B, the change in frequency of local oscillator 40 is directly proportional to the change in the frequency adjustment signal 80 received by the local oscillator 40. In these embodiments, the desired frequency is labeled F1 and is equal to the frequency of the reference oscillator 34 in the central unit 62. The starting frequency of the local oscillator 40 is labeled F2. The horizontal axes are divided into periods of time labeled $\Delta T$ corresponding to the amount of time needed for a single operation of the frequency synchronization method. The maximum allowable change in the frequency adjustment signal 80 is labeled $\Delta V_{MAX}$ and corresponds to the maximum change in frequency of the local oscillator 40 which is labeled $\Delta F_{MAX}$. The minimum allowable change in the frequency adjustment signal 80 is labeled $\Delta V_{MIN}$ and corresponds to the minimum change in frequency of the local oscillator 40 which is labeled $\Delta F_{MIN}$.

As one example, FIG. 7A shows a case where the maximum allowable change $\Delta V_{MAX}$ in the frequency adjustment signal 80 changes the frequency of the local oscillator 40 to be at least substantially the same as the target frequency F1. This change can therefore be accomplished in one $\Delta T$ time. Thereafter, only the minimum allowable change $\Delta V_{MIN}$ in the frequency adjustment signal 80 is needed to stay at the target frequency F1. In FIG. 7B, however, the maximum allowable change $\Delta V_{MAX}$ in the frequency adjustment signal 80 is not sufficient to change the frequency of the local oscillator 40 to be at least substantially the same as the target frequency F1. Therefore, more than one $\Delta T$ time is needed to change the frequency of the local oscillator 40 to be at least substantially the same as the target frequency F1. Thereafter, only the minimum allowable change $\Delta V_{MIN}$ in the frequency adjustment signal 80 is needed to stay at the target frequency F1. This illustrates a tradeoff that may be necessary between the length of $\Delta T$ time and the number of $\Delta T$ times that it takes to change the frequency of the local oscillator 40 to be at least substantially the same as the target frequency F1.

Figure 8:
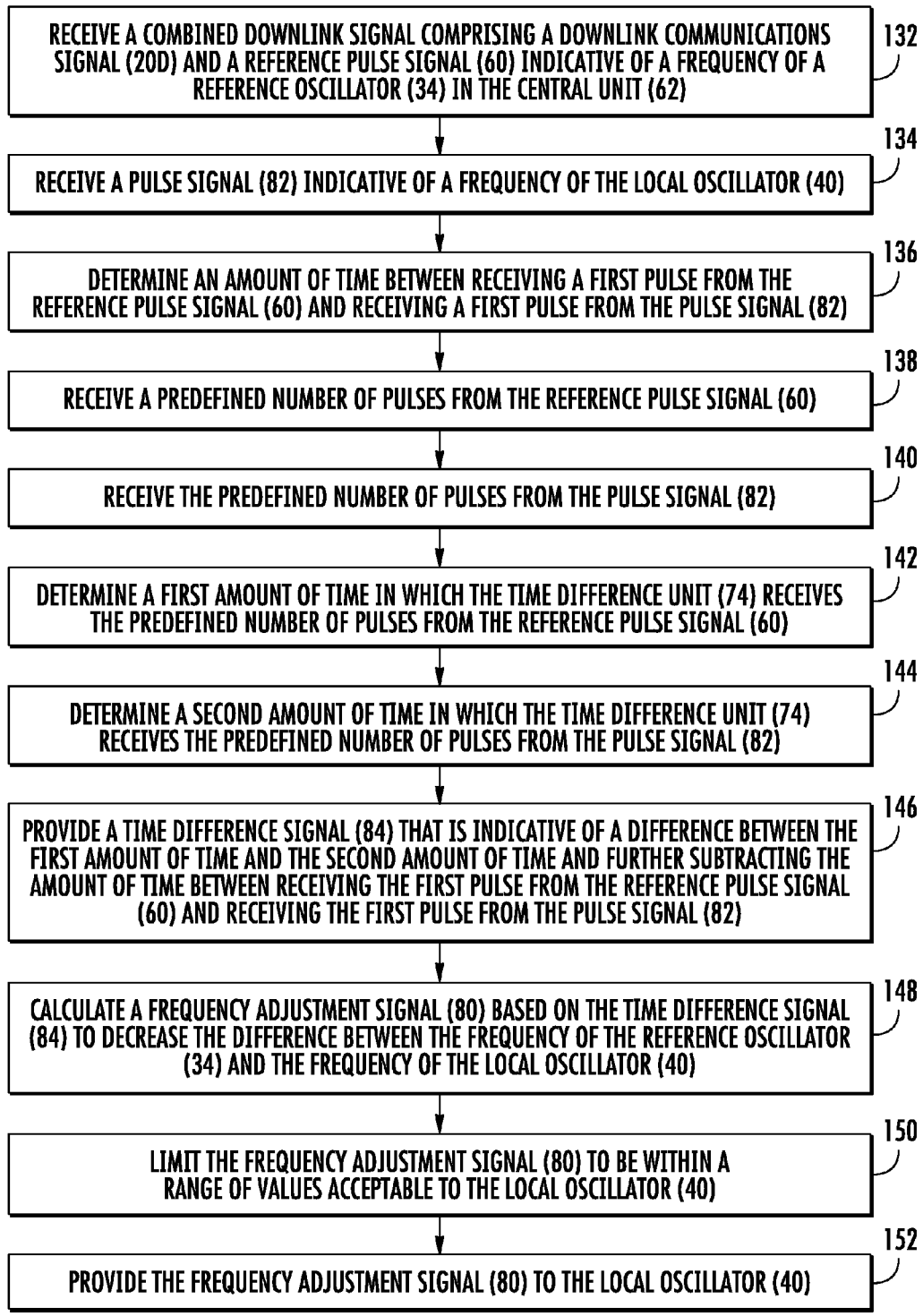
FIG. 8 is a flowchart illustrating an exemplary process for frequency synchronizing the local oscillator in the remote unit in the DAS of FIG. 5 used for frequency shifting communications signals based on the received digital pulse signal from the central unit where a predefined number of pulses are counted in each pulse signal, according to one embodiment.

To further explain an exemplary process of operating the system in FIG. 5 for frequency synchronizing a local oscillator in a remote unit in a DAS used for frequency shifting communications signals based on a received digital pulse signal from a central unit, the flowchart in FIG. 8 is provided. As discussed above, the remote unit 58 receives a combined downlink signal such as frequency shifted downlink communications signals 20U' comprising a downlink communications signal 20D and a reference pulse signal 60 indicative of a frequency of a reference oscillator 34 in a central unit 62 (block 132). Next, the remote unit 58 receives a pulse signal 82 indicative of a frequency of the local oscillator 40 (block 134). The time difference unit 74 further determines an amount of time between receiving a first pulse from the reference pulse signal 60 and receiving a first pulse from the pulse signal 82 (block 136). The remote unit 58 then receives a predefined number of pulses from the reference pulse signal 60 (block 138) and receives the predefined number of pulses from the pulse signal 82 (block 140). The time difference unit 74 then determines a first amount of time in which the time difference unit 74 receives the predefined number of pulses from the reference pulse signal 60 (block 142) and determines a second amount of time in which the time difference unit 74 receives the predefined number of pulses from the pulse signal 82 (block 144). The time difference unit 74 then provides a time difference signal 84 that is indicative of a difference between the first amount of time and the second amount of time and further subtracting the amount of time between receiving a first pulse from the reference pulse signal 60 and receiving a first pulse from the pulse signal 82 (block 146). The frequency adjustment unit 76 then calculates a frequency adjustment signal 80 based on the time difference signal 84 to decrease the difference between the frequency of the reference oscillator 34 and the frequency of the local oscillator 40 (block 148). The limiter 128 then limits the frequency adjustment signal 80 to be within a range of values acceptable to the local oscillator 40 (block 150). The frequency adjustment unit 76 then provides the frequency adjustment signal 80 to the local oscillator 40 (block 152).

Figure 9:
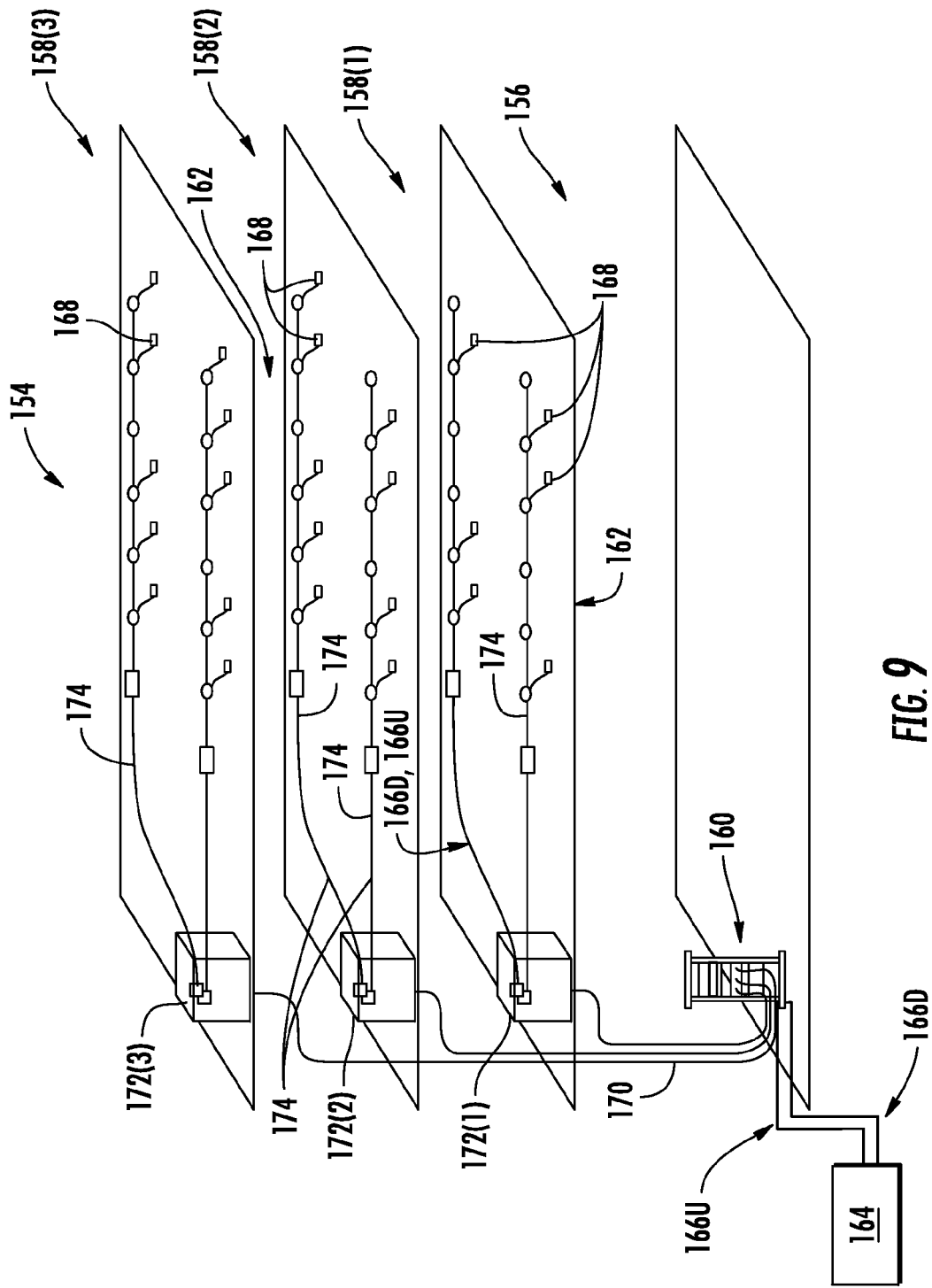
FIG. 9 is a partially schematic cut-away diagram of an exemplary building infrastructure in which a DAS including the central unit and one or more remote units of FIG. 2 or FIG. 5 can be employed.

A DAS 154 may also be provided in an indoor environment, as illustrated in FIG. 9. FIG. 9 is a partially schematic cut-away diagram of a building infrastructure 156 employing the DAS 154 described herein. The building infrastructure 156 in this embodiment includes a first (ground) floor 158(1), a second floor 158(2), and a third floor 158(3). The floors 158(1)-158(3) are serviced by a central unit 160 to provide antenna coverage areas 162 in the building infrastructure 156. The central unit 160 is communicatively coupled to a base station 164 to receive downlink communications signals 166D from the base station 164. The central unit 160 is communicatively coupled to remote units 168 to receive uplink communications signals 166U from the remote units 168, as discussed above. The downlink and uplink communications signals 166D, 166U communicated between the central unit 160 and the remote units 168 are carried over a riser cable 170. The riser cable 170 may be routed through interconnect units (ICUs) 172(1)-172(3) dedicated to each floor 158(1)-158(3) that route the downlink and uplink communications signals 166D, 166U to the remote units 168 and also provide power to the remote units 168 via array cables 174.

Figure 10:
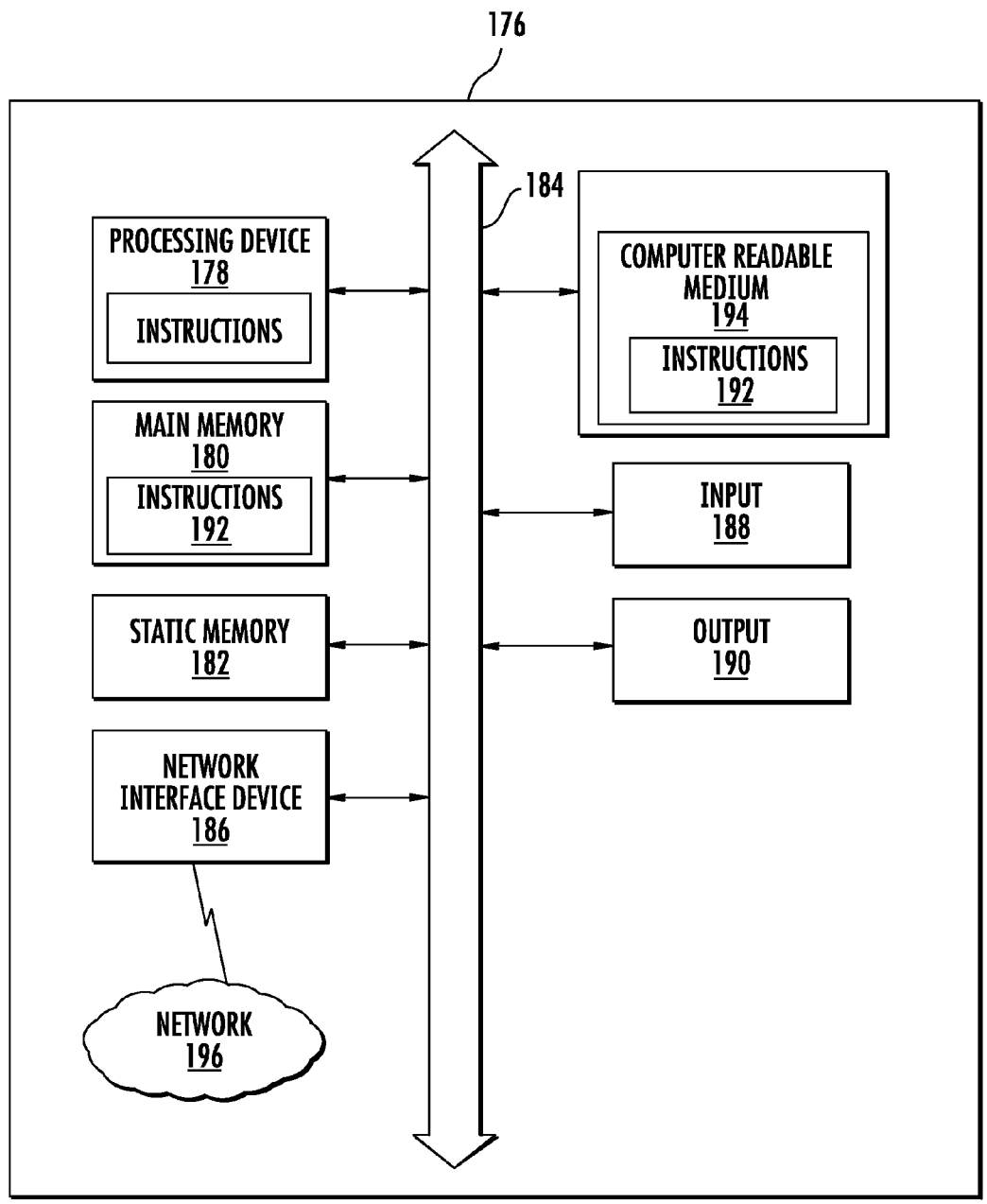
FIG. 10 is a schematic diagram of a generalized representation of an exemplary controller unit that can be included in any central unit, remote unit, and/or any other components of a DAS or other system, for frequency synchronizing the local oscillator in the remote unit in a DAS used for frequency shifting communications signals based on the received digital pulse signal from the central unit, wherein the exemplary controller unit is adapted to execute instructions from an exemplary computer-readable medium.

In this regard, a controller unit 176 in FIG. 10 may include a set of instructions that may be executed to simultaneously sample serial digital data streams from multiple ADCs. The controller unit 176 may be connected (e.g., networked) to other machines in a LAN, an intranet, an extranet, or the Internet. While only a single device is illustrated, the term "device" shall also be taken to include any collection of devices that individually or jointly execute a set (or multiple sets) of instructions to perform any one or more of the methodologies discussed herein. The controller unit 176 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer.

The exemplary controller unit 176 in this embodiment includes a processing device or processor 178, a main memory 180 (e.g., read-only memory (ROM); flash memory; dynamic random access memory (DRAM), such as synchronous DRAM (SDRAM); etc.), and a static memory 182 (e.g., flash memory, static RAM (SRAM), etc.), which may communicate with each other via a data bus 184. Alternatively, the processor 178 may be connected to the main memory 180 and/or the static memory 182 directly or via some other connectivity means. The processor 178 may be a controller, and the main memory 180 or the static memory 182 may be any type of memory.

The processor 178 represents one or more general-purpose processing devices, such as a microprocessor, central processing unit, or the like. More particularly, the processor 178 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 178 is configured to execute processing logic in instructions for performing the operations and steps discussed herein.

The controller unit 176 may further include a network interface device 186. The controller unit 176 also may or may not include an input 188, configured to receive input and selections to be communicated to the controller unit 176 when executing instructions. The controller unit 176 also may or may not include an output 190, including but not limited to a display, a video display unit (e.g., a liquid crystal display (LCD) or a cathode ray tube (CRT)), an alphanumeric input device (e.g., a keyboard), and/or a cursor control device (e.g., a mouse).

The controller unit 176 may or may not include a data storage device that includes instructions 192 stored in a computer-readable medium 194. The instructions 192 may also reside, completely or at least partially, within the main memory 180 and/or within the processor 178 during execution thereof by the controller unit 176, the main memory 180 and the processor 178 also constituting computer-readable media. The instructions 192 may further be transmitted or received over a network 196 via the network interface device 186.

While the computer-readable medium 194 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical media, and magnetic media.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a controller unit (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the controller unit memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such example decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a FPGA, or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A remote unit in a distributed antenna system (DAS), comprising:
    a radio signal interface configured to receive from a central unit, a combined downlink signal comprising a frequency shifted downlink communications signal and a reference pulse signal indicative of a frequency of a reference oscillator in the central unit over a communications medium;
    a local oscillator configured to generate a mixing frequency signal based on a frequency adjustment signal;
    a time difference unit, comprising:
        a reference pulse input configured to receive the reference pulse signal from the combined downlink signal;
        a pulse input configured to receive a pulse signal indicative of a frequency of the local oscillator; and
        the time difference unit configured to provide a time difference signal on a time difference output indicative of a difference between the frequency of the reference oscillator and the frequency of the local oscillator;
    a frequency adjustment unit, comprising:
        a time difference input electrically coupled to the time difference output of the time difference unit, the time difference input configured to receive the time difference signal; and
        a frequency adjustment output electrically coupled to the local oscillator;
        the frequency adjustment unit configured to provide a frequency adjustment signal on the frequency adjustment output based on the time difference signal received on the time difference input to decrease the difference between the frequency of the reference oscillator and the frequency of the local oscillator; and
    a demodulator configured to separate the reference pulse signal from the combined downlink signal,
    wherein the combined downlink signal comprises the frequency shifted downlink communications signal and a digital management signal which comprises the reference pulse signal indicative of the frequency of the reference oscillator in the central unit over the communications medium.

2. The remote unit of claim 1, wherein the frequency adjustment unit is configured to provide the frequency adjustment signal formulaically on the frequency adjustment output based on the time difference signal received on the time difference input.

3. The remote unit of claim 1, wherein the frequency adjustment unit is configured to provide the frequency adjustment signal on the frequency adjustment output by by consulting a lookup table using the time difference signal received on the time difference input.

4. The remote unit of claim 1, wherein the frequency adjustment unit is configured to provide the frequency adjustment signal on the frequency adjustment output by being configured to provide a voltage level based on the time difference signal received on the time difference input.

5. The remote unit of claim 1, wherein the frequency adjustment unit is further configured to limit the frequency adjustment signal on the frequency adjustment output to be within a range of values acceptable to the local oscillator.

6. The remote unit of claim 1, wherein the frequency adjustment unit is configured to provide a frequency adjustment signal based on the time difference signal received on the time difference input such that the frequency of the local oscillator is within a factor of $10^{-8}$ of the frequency of the reference oscillator.

7. A remote unit in a distributed antenna system (DAS), comprising:
    a radio signal interface configured to receive from a central unit, a combined downlink signal comprising a frequency shifted downlink communications signal and a reference pulse signal indicative of a frequency of a reference oscillator in the central unit over a communications medium;
    a local oscillator configured to generate a mixing frequency signal based on a frequency adjustment signal;
    a time difference unit, comprising:
        a reference pulse input configured to receive the reference pulse signal from the combined downlink signal;
        a pulse input configured to receive a pulse signal indicative of a frequency of the local oscillator; and
        the time difference unit configured to provide a time difference signal on a time difference output indicative of a difference between the frequency of the reference oscillator and the frequency of the local oscillator; and a frequency adjustment unit, comprising:
  a time difference input electrically coupled to the time difference output of the time difference unit, the time difference input configured to receive the time difference signal; and
  a frequency adjustment output electrically coupled to the local oscillator;
  the frequency adjustment unit configured to provide a frequency adjustment signal on the frequency adjustment output based on the time difference signal received on the time difference input to decrease the difference between the frequency of the reference oscillator and the frequency of the local oscillator, wherein the time difference unit is configured to provide a time difference signal on a time difference output by being configured to:
  receive a predefined number of pulses from the reference pulse signal;
  receive the predefined number of pulses from the pulse signal;
  determine a first amount of time in which the time difference unit receives the predefined number of pulses from the reference pulse signal;
  determine a second amount of time in which the time difference unit receives the predefined number of pulses from the pulse signal; and
  provide a time difference signal that is indicative of a difference between the first amount of time and the second amount of time.

8. The remote unit of claim 7, wherein the time difference unit is configured to receive a pulse by being configured to detect a rising edge of the pulse.

9. The remote unit of claim 7, wherein the time difference unit is configured to receive a pulse by being configured to detect a falling edge of the pulse.

10. The remote unit of claim 7, wherein the time difference unit is further configured to determine a third amount of time between receiving a first pulse from the reference pulse signal and receiving a first pulse from the pulse signal; and
  the time difference unit is configured to provide the time difference signal indicative of a difference between the first amount of time and the second amount of time and further subtracting the third amount of time.

11. The remote unit of claim 7, wherein the predefined number of pulses is greater than or equal to one second divided by a time period of a pulse.

12. A method for frequency synchronizing a local oscillator in a remote unit in a distributed antenna system (DAS), comprising:
  receiving a combined downlink signal comprising a frequency shifted downlink communications signal and a reference pulse signal indicative of a frequency of a reference oscillator in a central unit;
  receiving a pulse signal indicative of a frequency of the local oscillator;
  providing a time difference signal indicative of a difference between the frequency of the reference oscillator and the frequency of the local oscillator;
  providing a frequency adjustment signal to the local oscillator based on the time difference signal to decrease the difference between the frequency of the reference oscillator and the frequency of the local oscillator;
  generating a frequency signal based on the frequency adjustment signal to provide to a mixer; and
  generating downlink communications signals by mixing the frequency shifted downlink communications signals with the generated frequency signal; wherein
  providing the time difference signal comprises:
    receiving a predefined number of pulses from the reference pulse signal;
    receiving the predefined number of pulses from the pulse signal;
    determining a first amount of time in which a time difference unit receives the predefined number of pulses from the reference pulse signal;
    determining a second amount of time in which the time difference unit receives the predefined number of pulses from the pulse signal; and
    providing a time difference signal that is indicative of a difference between the first amount of time and the second amount of time.

13. The method of claim 12, further comprising separating the reference pulse signal from the combined downlink signal prior to receiving the pulse signal.

14. The method of claim 12, further comprising determining a third amount of time between receiving a first pulse from the reference pulse signal and receiving a first pulse from the pulse signal and wherein providing the time difference signal comprises providing a time difference signal that is indicative of a difference between the first amount of time and the second amount of time and further subtracting the third amount of time.

15. The method of claim 12, further comprising limiting the frequency adjustment signal to be within a range of values acceptable to the local oscillator prior to providing a frequency adjustment signal to the local oscillator.

* * * * *